United States Patent
Chapman

(10) Patent No.: US 9,805,148 B2
(45) Date of Patent: Oct. 31, 2017

(54) MODELING AND SIMULATION ANALYTICAL REPLY METHOD

(71) Applicant: Michael Chapman, California, MD (US)

(72) Inventor: Michael Chapman, California, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 745 days.

(21) Appl. No.: 14/462,080

(22) Filed: Aug. 18, 2014

(65) Prior Publication Data

US 2016/0048613 A1 Feb. 18, 2016

(51) Int. Cl.
*G06F 17/50* (2006.01)
(52) U.S. Cl.
CPC ................. *G06F 17/5009* (2013.01)
(58) Field of Classification Search
CPC .................................. G06F 17/5009
USPC ............................................. 703/6
See application file for complete search history.

(56) References Cited

U.S. PATENT DOCUMENTS

| | | | |
|---|---|---|---|
| 6,882,965 B1 * | 4/2005 | Hoover | G06F 17/5022 703/14 |
| 7,349,838 B2 * | 3/2008 | Summers | G06Q 10/10 434/107 |
| 2011/0307233 A1 * | 12/2011 | Tseng | G06F 17/5022 703/14 |
| 2015/0286626 A1 * | 10/2015 | Romatier | G05B 17/02 715/217 |

* cited by examiner

*Primary Examiner* — Andy Ho
(74) *Attorney, Agent, or Firm* — Mark O. Glut; Charles Buskey; NAWCAD

(57) ABSTRACT

The invention is directed to a method for discrete-event simulation, using dynamic memory in a parallel environment under Cautious Optimistic Control (COC). The method is divided into three sub-processes. The first is the pre-processing phase, which prepares the simulation for event execution. The second is the execution phase, which prepares the simulation for event execution. The third is the post-processing phase, which handles the cleanup of the simulation after the end of event execution. The invention can be integrated into various software architectures for run-time use or in post-processing analysis for data analysis in test and evaluation environments.

15 Claims, 9 Drawing Sheets

MODELING AND SIMULATION ANALYTICAL REPLY METHOD

STATEMENT OF GOVERNMENT INTEREST

The invention described herein may be manufactured and used by or for the Government of the United States of America for governmental purposes without payment of any royalties thereon or therefore.

BACKGROUND

Modeling and simulation provides an important component in the development and testing of modern systems. In the early stages of development, this usually took the form of purely constructive (i.e. simulation only) testing wherein large numbers of simulation runs were necessary to provide the needed level of statistical certainty.

In the current state of modeling and simulation development, testing is usually conducted on systems installed in simulation environments. In these simulation environments, time and resources are generally limited, due to the expensive equipment and labor force required to run the simulations. When unusual or unexpected behavior is encountered the analysts generally either rerun the test to capture additional data or reset the test to a new initial state, changing key state variables and rerunning the test to determine if there were different results. These additional tests require additional time and money which may not be available. The alternative is to capture all possible data for every given test run. The disadvantage to this alternative is that tremendous amounts of data can be produced making subsequent analysis more difficult. This also extends run time, which may not be desirable, particularly when dealing with man or system in the loop testing where real time simulation is necessary. In addition, making state changes to initial variables while insuring that these state changes do not impact other aspects of the simulation can be very difficult.

Therefore, there is a need for an improved method for collecting data from modeling and simulation programs and a new mechanism for analyzing the consequences of state changes within the simulation.

SUMMARY

The present invention is a novel method for data storage and processing in modeling and simulation programs. This method allows analysts access to all state information within a simulation at any given time period within an analytical run (not just the data the analyst chose to capture prior to run time). This provides the analyst with the ability to investigate unexpected, incongruous results without the need to perform additional data runs.

The analyst is free to move forward or backward in time within the simulation, with full access to all state variables. This includes the full cognitive state of simulation entities as well as their physical state. This is done without requiring the simulation to be rerun or the analyst to predetermine the analytical data required prior to runtime. Also, this method does not severely impact runtime requirements (e.g. maintenance of real time execution).

The method also permits the analyst to change state variables at some point in the past, save and run the simulation from that point to examine the causal effects of changes. The method functions by first using a discrete event, time stepped simulation mechanism. Next, the method utilizes dynamic storage allocation within an initial static memory allocation. Lastly the method uses immediate or deferred state modification in parallel with event execution via Cautious Optimistic Control (COC).

Consequently, this new mechanism provides the analyst with the ability to rewind a simulation to a given time stamp, change the state variable(s) of interest, then rerun the simulation from the changed state, while maintaining full causality, thus insuring that any changes in behavior are directly linked to the introduced state changes.

The primary advantage of the invention is that it significantly increases the simulation data available to an analyst and presents it in a well-ordered manner. The analyst is no longer confined to the data that was deemed to be of interest prior to simulation execution. Also because the data manipulation is conducted within the memory map of the simulation, much of the post-run sorting and filtering of data is handled by the simulation itself and not the analyst. Additionally, the ability to change states and rerun the simulation makes it easier for an analyst to devise excursions from a baseline case to investigate unusual behaviors.

The features, aspects and advantages of the present invention are shown with reference to the following description, appended claims, and accompanying drawings wherein:

DRAWINGS

DESCRIPTION

In the following description of the present invention, reference will be made to various embodiments which are not meant to be all inclusive. The current invention can be implemented using various forms of software and hardware.

The preferred embodiments of the present invention are illustrated by way of example below and in FIGS. 1-9.

Simulations handle time management by one of two methods; time-stepped or event-stepped. Each mechanism has its advantages and disadvantages. Time-stepped simulations calculate all state data for a given time-increment, making it well suited for modeling continuous processes. The disadvantage of time-stepped simulations is that the time-increment is usually driven at the rate of the fastest interaction. With large entity counts, this can result in insufficient processing time to calculate all necessary state changes. Another disadvantage is that all state variables change, making it prohibitive (from a memory usage standpoint) to record and save state changes for rolling back time.

In an event-stepped simulation, time is advanced by executing events, which themselves are assumed to take no time. During an event, only those state variables that are actually needed are calculated and changed. The disadvantage of event-stepped simulations is that it is more difficult to represent continuous interactions, or interactions that take time to complete. The advantage of event-stepped simulations is that they can handle large entity counts since fewer computations are needed in an event. Another advantage is that since only those state variables that change within the event need to be stored for rolling back time, memory usage is significantly reduced. A third advantage is that the events provide a logical method both for managing the rollback of time and managing the storage of state changes. For these reasons, this invention uses the event-stepped mechanism.

There are numerous methods for implementing dynamic memory within a static memory limitation, with significant advantages to using each of them. For this invention, instead of dynamic memory allocation through the operating system, a single memory array allocation is utilized. Through the static allocation process, this invention has a single, contiguous block of system memory which provides two significant building blocks. First, a simple binary dump of the array provides a snapshot of all simulation data for a given instance of game time. Second, the array provides a known memory map allowing the tracking of state changes by memory location, allowing for an efficient method for rollback of time.

Figure 1:
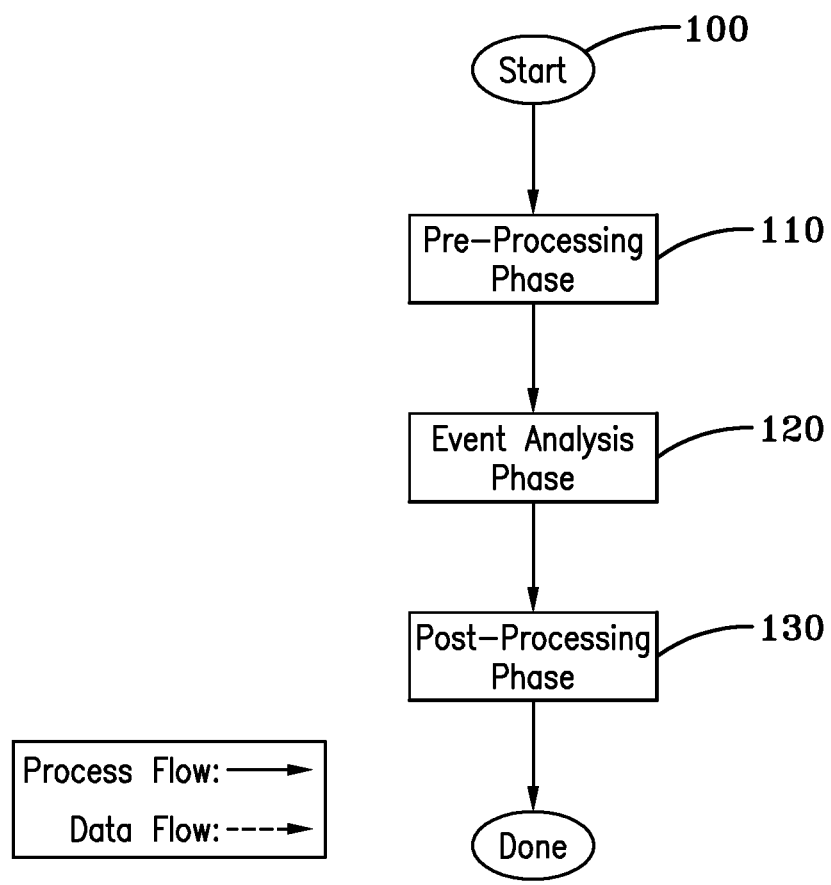
FIG. 1 is flowchart of the process of the invention including each sub-process.

Referring to FIG. 1, the current invention is divided into three sub-processes. The first is the pre-processing phase (110). This phase prepares the necessary data structures. The second is the event analysis phase (120). It is within this phase that the user controls the flow of time, moving forward and backward within the events and examining state variables as necessary, and possibly changing those states in preparation for another run of the simulation. The final sub-phase is the post-processing phase (130). This phase is optional, and only necessary if the user has changed states and wishes to re-run the simulation using the modified state values.

One of the goals of this invention is to create a mechanism for insuring the maintenance of total event ordering and full causality when executing events in parallel on multi-processor computers. Events that do not affect the same entities can be processed in parallel. However, in discrete event simulation, it is possible for such events to generate new events that could impact entities in other events that are already executing. This requires a mechanism for cancelling the effects of the executing event and reverting to the pre-event execution state. Under immediate modification, when the event is executed, all state changes are made during event execution, but the previous state is stored within a data structure called a result. If the event must be rolled back, its results are used to return once the new events have made their appropriate state changes. However, no action is required once the event is SAFED (i.e. made safe). This means that and event can no longer be impacted by any executing event. That is, when dealing with event-stepped simulations, an event can be impacted by the actions of other events, as long as those events are earlier in time, or can schedule a child event that is earlier. At some point, the event becomes the earliest possible event in the simulation, and can no longer be impacted by any other event. At this point, it is safe to implement any state changes from the event. On the contrary, deferred modification calculates and stores the necessary state changes for an event in a result, and then implements it once the event is safe, requiring no action if an event must be rolled back. This invention can work with either mechanism. The appropriate mechanism to be used depends on the characteristics of the simulation in which the invention is implemented. Under COC, the results are deleted once they are no longer needed, and thus COC parallelization is limited to rolling back only currently executed events.

This invention utilizes standard dynamic memory methods. For the event-stepped methods, there are some key characteristic the chosen method must have, but any standard method meeting these criteria can be used. However, COC will require one significant change; all results for an event will need to be saved rather than discarded. The most efficient method for this would be via a memory mapped file.

Dynamic memory methods generally make use of a single contiguous block of system memory that is the union of a real and integer array. We will refer to this as the general array. Writing this memory to a system file will be referred to as a binary dump. All memory usage by the simulation is allocated and de-allocated from this array and all changes to state variables are made with the array using known data structures. This will be referred to as the memory map of the general array.

Figure 2:
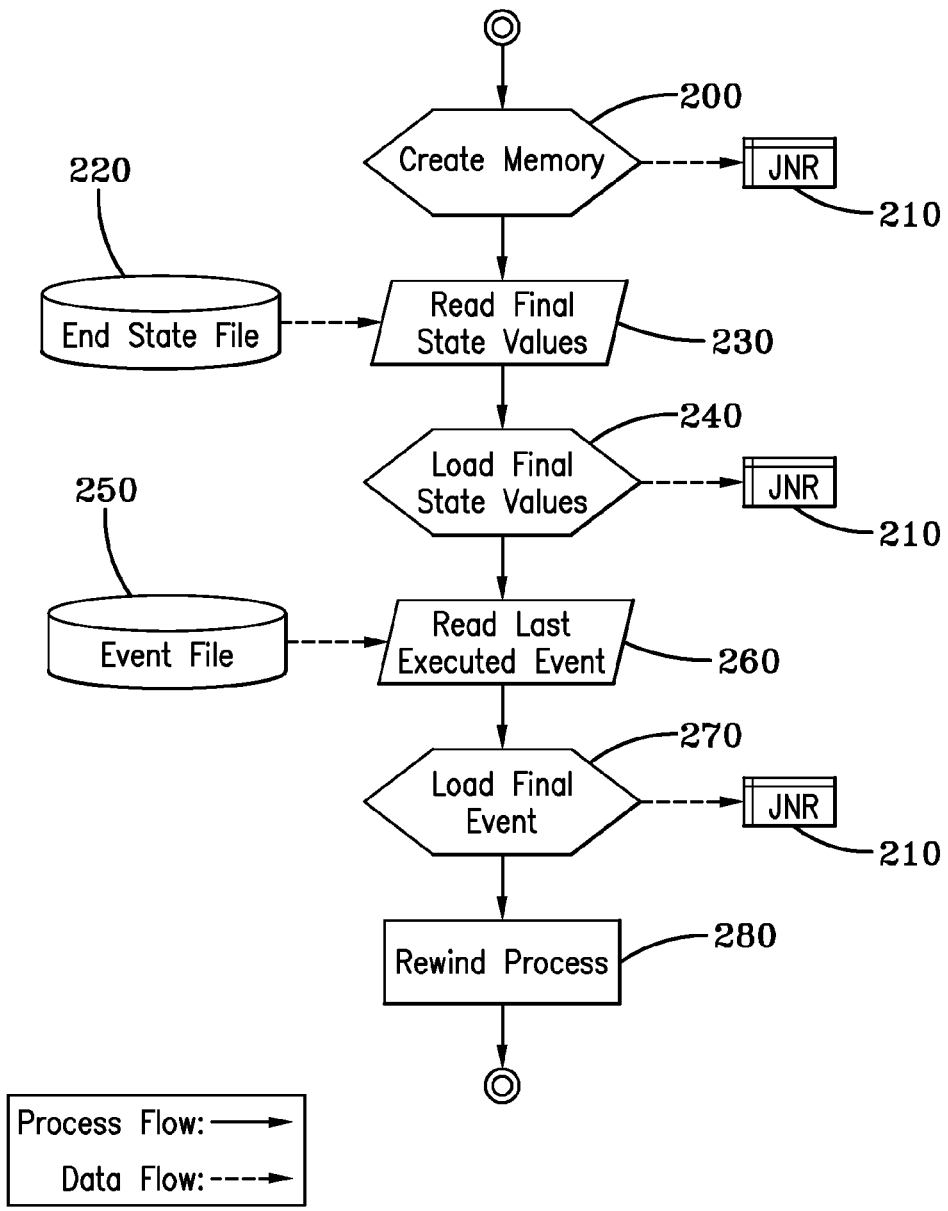
FIG. 2 is a flowchart of the pre-processing phase of the invention.

The initial dynamic memory is set up in the pre-processing phase (110). FIG. 2 shows the details of the pre-processing phase. The first step (200) is creating the dynamic memory, i.e. the general array (JNR (210)). Then the final state values are read (230) from an end state file (220) and loaded (240) into the general array (210). The end state file (220) is produced in the post-processing phase of the method. Next the last executed event is read (260) from an event file (250) produced by a lower critical region (LCR) safe process of the method and loaded (270) into the general array (210). Finally, the rewind-process (280) is run on the last executed event. At this point, the general array (210) is in the proper state prior to the execution of the end of game event. The method is now ready for event analysis phase.

Figure 3:
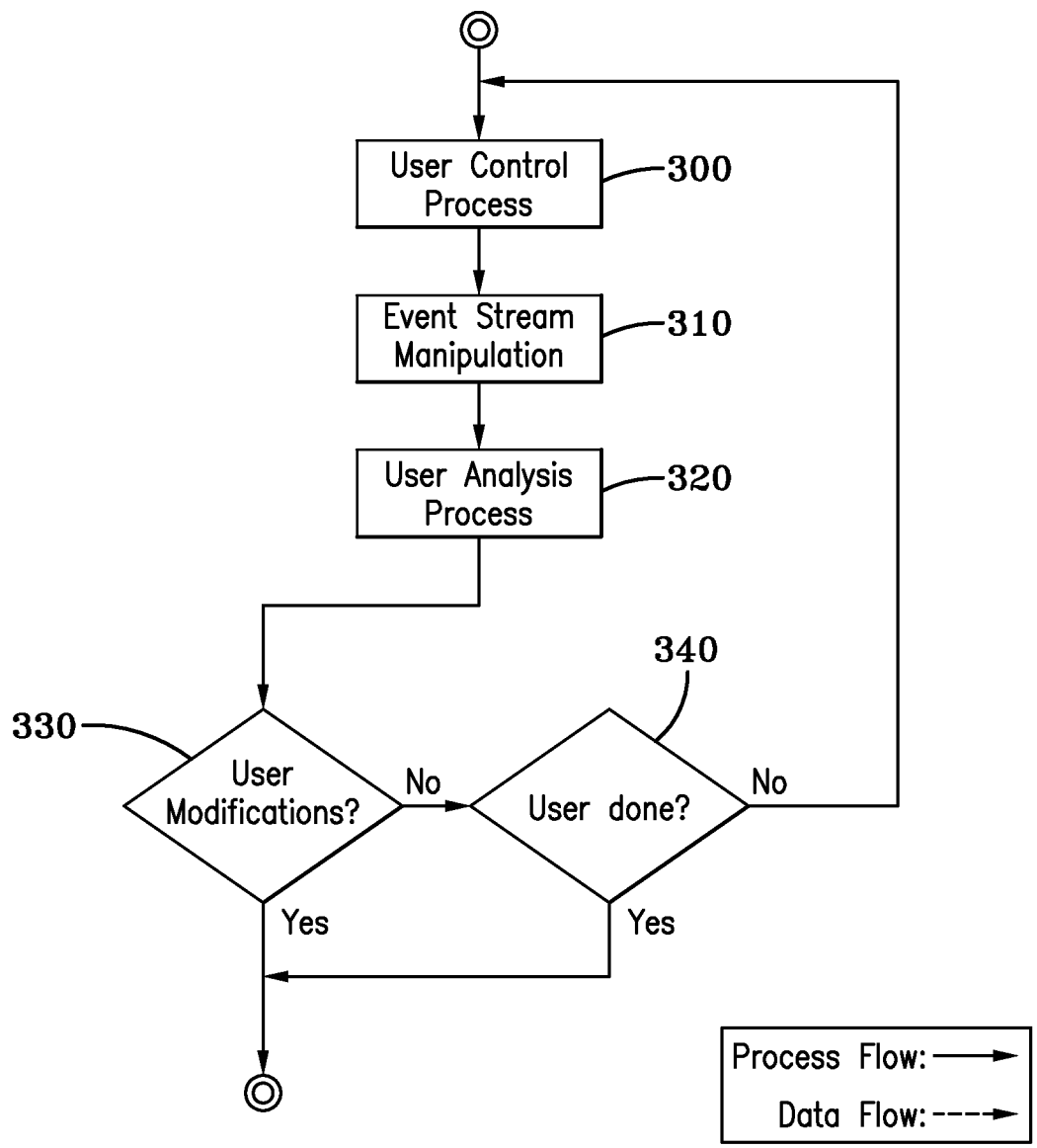
FIG. 3 is a flowchart of the event analysis phase of the invention.

The event analysis phase is the heart of the invention and it is here where the event stream is manipulated and presented to the user with the necessary analytical data. FIG. 3 shows the three phases of the event analysis phase. The first is the user control process (300). This process obtains the desired event manipulation from user input. The second is the event stream manipulation process (310). Here, the user can move forward and backward through the event stream using commands, and restoring simulation state data as necessary. Once the desired time is reached, the user analysis process (320) begins. In this user analysis process (320) the user is presented the current state data of interest. Additionally, the user has the option of modifying the current state data (330) for a new run of the simulations. Finally, if the user has modified the state data, the method moves to the post-processing phase, because further manipulation of the event stream is no longer feasible. If the user has not modified the data, he is asked if he has finished analysis (340). If so, the method moves to the post-processing phase, otherwise, the method returns to the user control process.

During the user control process, the user is merely indicating a time in the simulation past that he is interested in and directing the program to restore the simulation state variables for that time stamp. However, in discrete-event simulation, generally there are multiple events occurring at the same time. Moreover, in order to insure causality and repeatability, chronologically simultaneous events must still be sequenced within the time ordering. That is, two simultaneous events are not actually simultaneous for the purposes of execution, and one must precede the other when the events are SAFED. Usually this is handled by assigning a newly created event with a unique identifier which increases linearly with each subsequent event (sometimes referred to as a second key). Thus, if two events occur at one time, the one with the lower second key is SAFED first. This means that there will generally be more than one event at a given user specified time stamp.

Further, a discrete event simulation typically can have a zero look-ahead time, which means that a currently executing event can schedule a child event for exactly the same time as the current event. Also, the child event can share simulation objects with events other than the parent event. Consequently, there could be more than one event at a given user specified time stamp for the same simulation object of interest.

Figure 4:
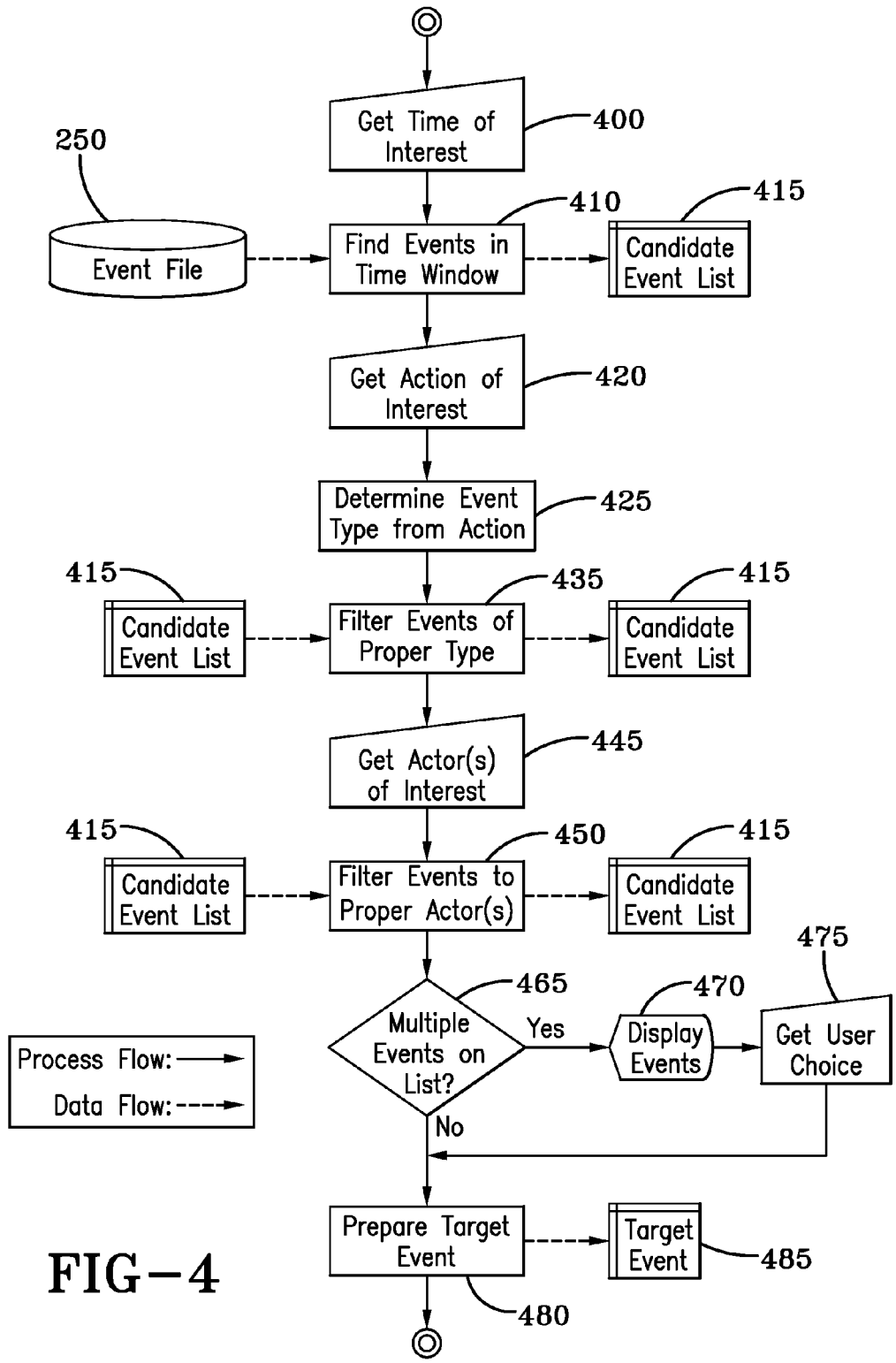
FIG. 4 is a flowchart of the user control process of the invention.
Figure 5:
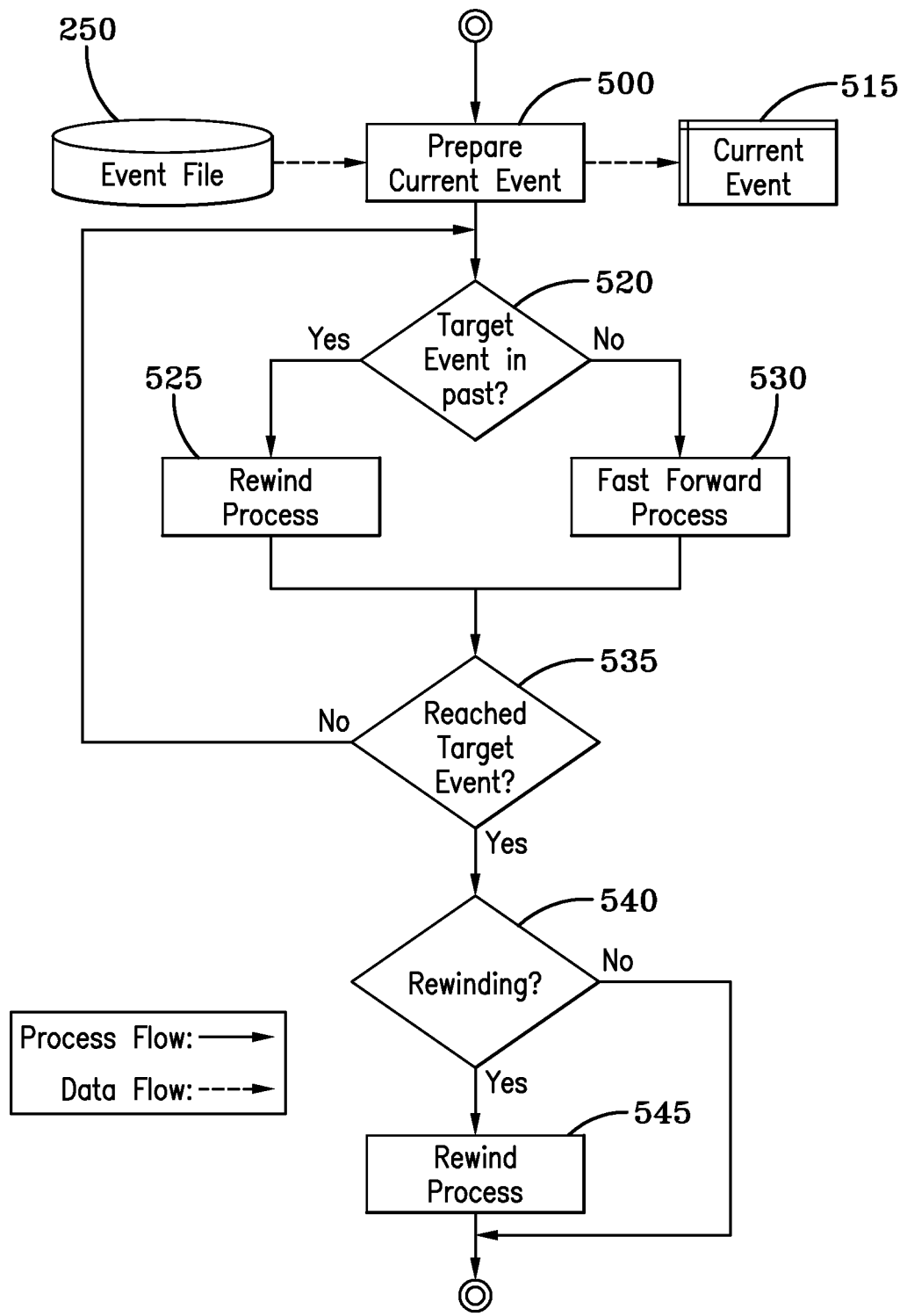
FIG. 5 is a flowchart of the event stream manipulation process of the invention.

FIG. 4 shows the user control process which comprises the steps for determining and presenting the event of interest for user control. First, we obtain the time of interest (400). From that specified time frame, we can determine a time window in which to search for all events that occurred. Next, using an event file (250) and candidate event list (415) we find all events in the time window on interest (410). Next, we obtain the action of interest from the user (420). From the action taken we can determined the type of event that occurred (425) and from a candidate event list (415), we can filter out all events that do not match this type. Next we obtain the actor(s) of interest (445). With knowledge of the actors involved and the candidate event list (415) we can filter events to proper actor(s) (450) to determine the specified event. It is conceivable that we could still have multiple events that immerge from this filtering process, but that is rare in actual practice. However, if it does occur (465), we can display the events to the user (470), perhaps with auxiliary data, and get the user's choice (475). The final step is to prepare (480) and present the target event (485).

Now, we are ready for the event stream manipulation process which is responsible for restoring the state variables of the simulation to what existed prior to the execution of the event selected in the user control process.

First, we determine if the target event lies in the future or in the past relative to the current event location (520). The first time we enter this process, the event must exist in the past, as we start from the end state and the last executed event, which would be the End Game Event. If the event is in the past, we use the rewind process (525) to undo the state changes of each intermediate event until we have rolled back the target event (535). If the event is in the future, we use the fast forward process (530) to apply the state changes of each intermediate event until we reach the target event (535), which itself is not applied. At this point, all state variables are at the appropriate value and we can proceed to the next step where the user can begin analysis.

Event-stepped simulations must make use of some form of time-ordered priority queuing to maintain event order and insure causality. There are numerous methods for this. However, for this invention, the exact method used is irrelevant, provided that it maintains an event ordering that is fully repeatable (i.e. it contains a mechanism for resolving the ordering of events with the same time stamp that always results in the same event sequence). An event queue is not needed by the invention, as the exact order of events is known after the simulation is run. Recording this order can be done with a simple linear list. However, a more elegant solution is for the playback method to utilize the same event queue mechanism as the original simulation. This has three advantages. First, priority queues are faster to search than linear lists when the number of events is large, and while run-time issues such as maintaining real-time don't apply, the efficiency of faster searches improves the practicality of the invention. Second, there is then opportunity for reuse of common code between the simulation and the playback application. Finally, by maintaining the queues, we enable the ability to modify state data and save a new binary dump, permitting the simulation to run from the new state.

Generally, event-stepped simulations discard event data once the event has been processed and, in the case of parallel execution, made safe. Information about state changes or actions taken may be recorded, but not the events or their input data. For this invention, of this data is stored in an ordered list of the events. This is necessary despite the fact that there is no intention of re-executing the events during playback because the information will be necessary for playback control. One must record the event type, game-time of execution, all actors involved, immediate preceding event, immediate following event, associated results and associated ramifications. To minimize impact to the simulation during the initial run, this data should not be recorded within the simulation's runtime execution memory but rather sent to system memory via a memory mapped file. This data is stored within the COC results and ramifications out of necessity for parallel event execution. Thus the use of COC mechanisms, even in non-parallel operations, readily solves this problem.

There are two basic methods in COC for using results to preserve state data and simulation causality in parallel operations. The first is immediate modification of state and the second is deferred modification of state. In immediate modification, state variables are changed during event execution as necessary and the original values are stored in a result. If the event is rolled back, the original states are restored from the result, otherwise the result is discarded. In deferred modification, the new state is either stored in the result or calculated in the result when it is applied. If the event is rolled back, the result is discarded, if the event is safe, the state modifications are implemented from the result. Either method will work with the invention. The preferred method would be dependent upon the conceptual model and basic architecture of the simulation in which the invention is being implemented.

In immediate state modification results for COC, only the old state data is saved. This is sufficient for parallelization, as we are only concerned with rolling back to the original state. However, for this invention we must be able to "roll forward" as well. That is, as the analyst plays back the simulation run, he will want to move forward in time as well as back. But re-executing the events is inefficient and unnecessary, given that the result of the event is known from the initial simulation run. This method implements this by storing both the new state data as well as the old data. Then when roll forward is required, we use the results of the event to change state variables to the new state data stored within the result. Similarly, for deferred modification, there is only the new state data, which easily permits roll forward but is insufficient for roll back. Again, storing both new and old state data allows for full movement in either direction in time. If state changes are calculated when a result is applied under deferred modification we would lose significant efficiency during playback, as we are effectively being forced to re-execute events during playback. However, we can store the newly calculated state data as part of the initial run, again avoiding the problem.

A ramification, under COC parallelization, is a term for a specific type of output generated by events. This output generally takes one of two forms. The first is state changes to the simulation that are either not specifically related to the simulations objects that were members of the executed event or impact the general state of the simulation, e.g. newly generated events. The second is generally output by the simulation to the user, e.g. graphical/textual/binary display of the state changes of the executed event. As with results, this information is usually discarded once the event is safe. Unlike results, this data does not necessarily have to be stored for later playback. The decision to store must be made on the basis of the architecture of the simulation in which the invention is being implemented.

This method will make modifications to the results and to the handling of results and ramifications that are not needed for COC. However, these modifications will not interfere with the ability of COC to function. Thus, parallelization via COC and the new method are not mutually exclusive.

The simulation in which the invention is implemented must be run normally before playback can be enabled. As described above the event stream, along with all necessary results and ramifications will be written out as binary data, together with a binary dump of the general array in its final state. This will serve as the initial input state of the playback method. The playback application will load the final state binary dump and present this to the analyst as the current state. The analyst can then choose the time interest that he wishes to examine.

Figure 6:
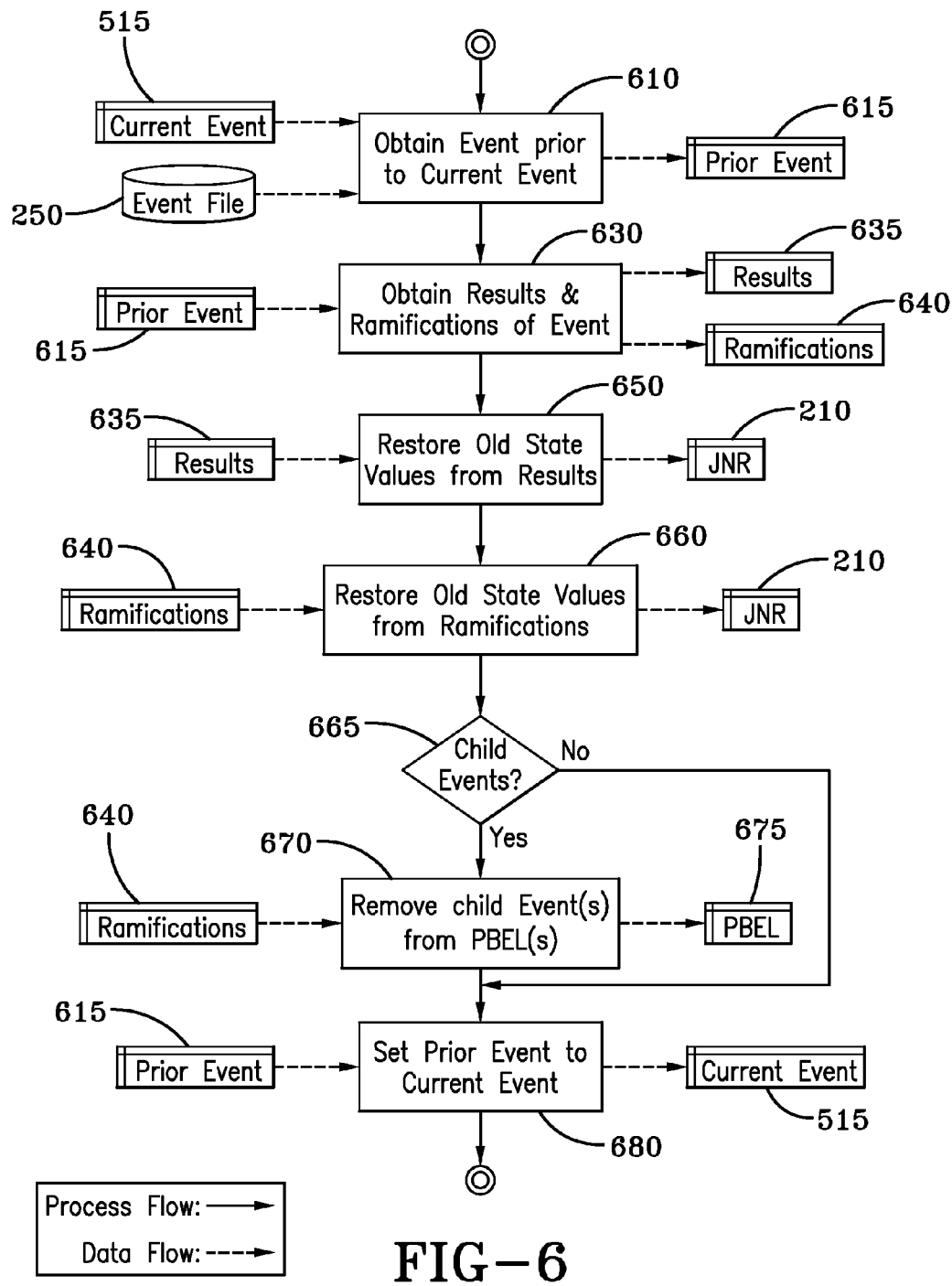
FIG. 6 is a flowchart of the rewind process of the invention.

The following procedure is used to roll back to the time of interest, and is graphically depicted in FIG. 6. First, using the stored current event (515) and event file (250), we obtain the event prior to current event and write it to a prior event file (615). From this prior event file (615), we obtain results and ramifications of the event (630) and write them to separate files (635 and 640). Using these results (635) and ramifications (640) we restore the old state values in steps (650) and (660) and write them to a general array (210). Then we check to see if there are any child events (e.g. ramifications) (665). If there are child events they are removed (670) from the Player Based Event List (PBEL). By this we mean that the child events are removed from the event queue, all output data associated with the current event is removed, and any mental processing information associated with the current event is deleted. In other words, under parallel event execution, each player maintains its own ordered list of events in which it is the subject player. The simulation then maintains a master event list that is the ordered list of the first entry on each player's PBEL. Thus, when executing events in parallel, the master event list, which can only be accessed by one event execution thread at a time, need only be accessed by a given thread if the top-most entry of the player PBEL changes. This significantly reduces collisions between parallel executing events and provides a convenient method for more easily handling the event searches. It does not matter which result mechanism, deferred modification or immediate modification, was used during the initial simulation run. In any case, the current state of the simulation includes all changed state data from the current event. Now, the prior event is pulled from the binary event list and becomes the current event. Note that no further action is needed, as the general array should now show the state of the simulation after this event was executed. This process is repeated until we reach the last event prior to the time of interest specified by the analyst.

Figure 7:
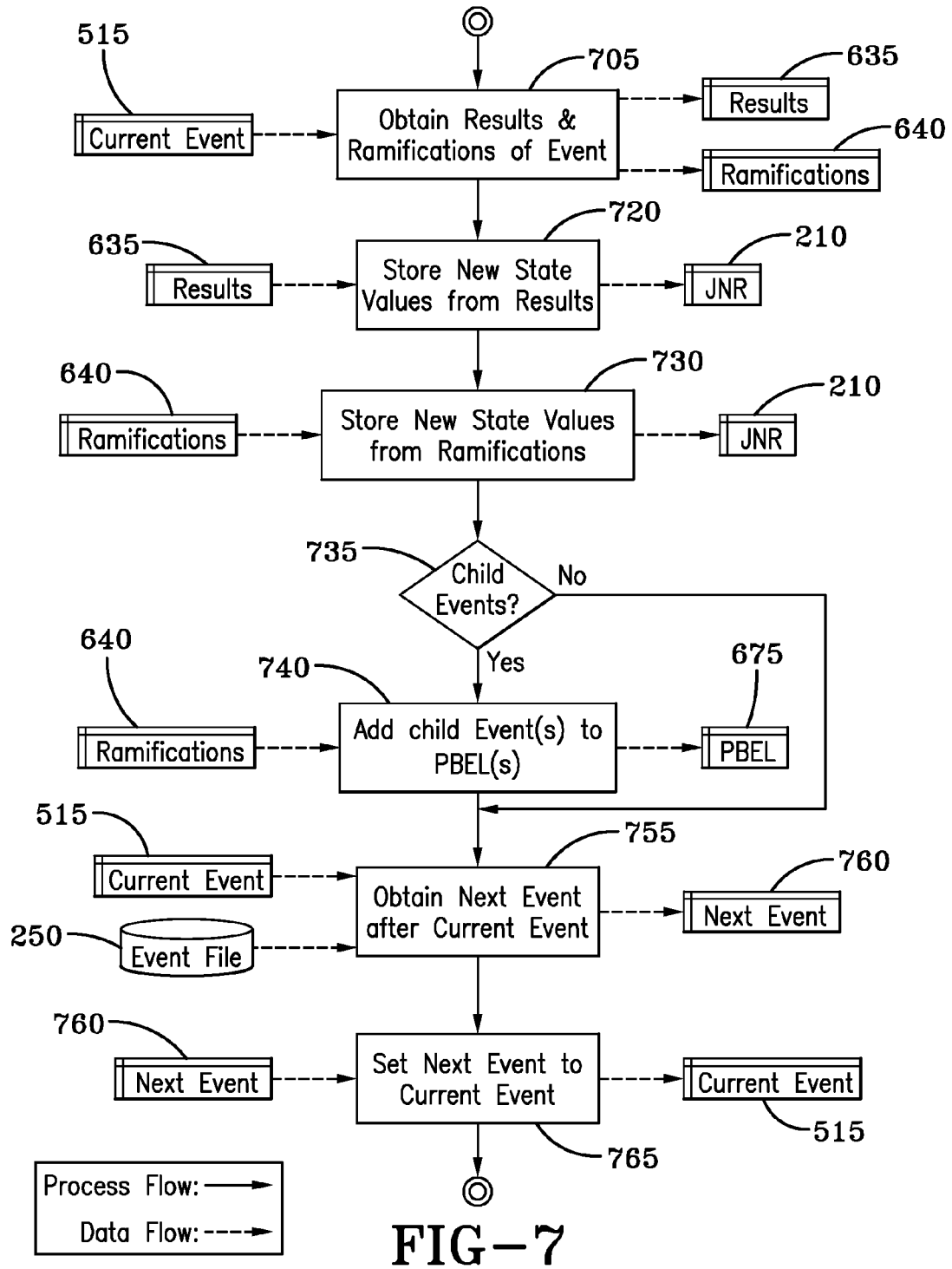
FIG. 7 is a flowchart of the fast forward process of the invention.

Having rolled back to the time of interest, the analyst may then wish to roll forward in time. The procedure for a rolling forward is depicted in FIG. 7 and described as follows. The process starts with a current event (515), which is the last event whose state variable modifications have yet to be implemented in the general array (210). First, the necessary changes for the current event (515) must be implemented. The results and ramifications associated with this event (705) are obtained. The results (635) are used to change the state value to the new values that resulted from the original execution (720) of the event under the existing method. Also the ramifications (640) are used to change the state value to the new values that resulted from the original execution (730) of the event under the existing method. Both new states are stored to the general array (210). Next we check the ramifications (640) for child events. We then apply the ramifications (640) of the next event. This means that all child events are added to the event queue (740), all output data is displayed appropriately and any mental processing information is stored in the PBEL (675). This process is repeated until we reach the next event after the current event of interest specified by the analyst in step (755), and write it to a next event file (760). Finally, we use this next event file (760) to set the next event to the current event in step (765). Now we have an updated current event (515). A current event is a pointer to a file and not actually a file itself. This process is changing the pointer from pointing to the file that contained the previous "current" event to pointing to the file that contains the next event, which then becomes the new "current" event.

Note, that not all the ramifications actually need to be processed. For example, a listing file output is one of the ramifications of an event. Under the existing method, the LCR safe process sends this data to either the simulations input/output (I/O) thread or directly to the operating system process. The invention does not need to do this. The data may be of interest to the user for analytical purposes, but that is presented as an option under the user analysis process. The only ramifications that must be implemented are the child events and state variable changes that were done to simulation objects that were not part of the event when it was executed.

Having reached the time of interest, the analyst now has access to two types of information. The first is the general array itself. From the known memory map, it is possible to examine the current state data for any entity within the simulation. The second is the ramifications data for the last executed event resulting in the current state of the general array. This data tells us how and why the events result in the current state data. The analyst can now make changes to the general array and/or to the ramifications lists, which at this point is stored in the general array. Saving the general array after these changes produces a binary input file that can then be feed back to the simulation engine, allowing the simulation to be run again with the new state changes. Since these are the only modifications made, any change in simulation behavior from the original run must, by necessity, be a causal result of these state changes, assuming that the simulation has control of its random number stream.

This portion of the method is the user analysis process and is where the full analytical power of the invention comes into play. The implementation of this process is simulation and user application specific. It is simulation specific because the state variables available for analysis are, by necessity, driven by the actual design architecture of the simulation on which the invention is being grafted. It is user application specific because the subset of the state variable set that is truly of interest to the user is driven by the analytical question the user is trying to investigate. Additionally, the process is extremely user interactive.

Figure 8:
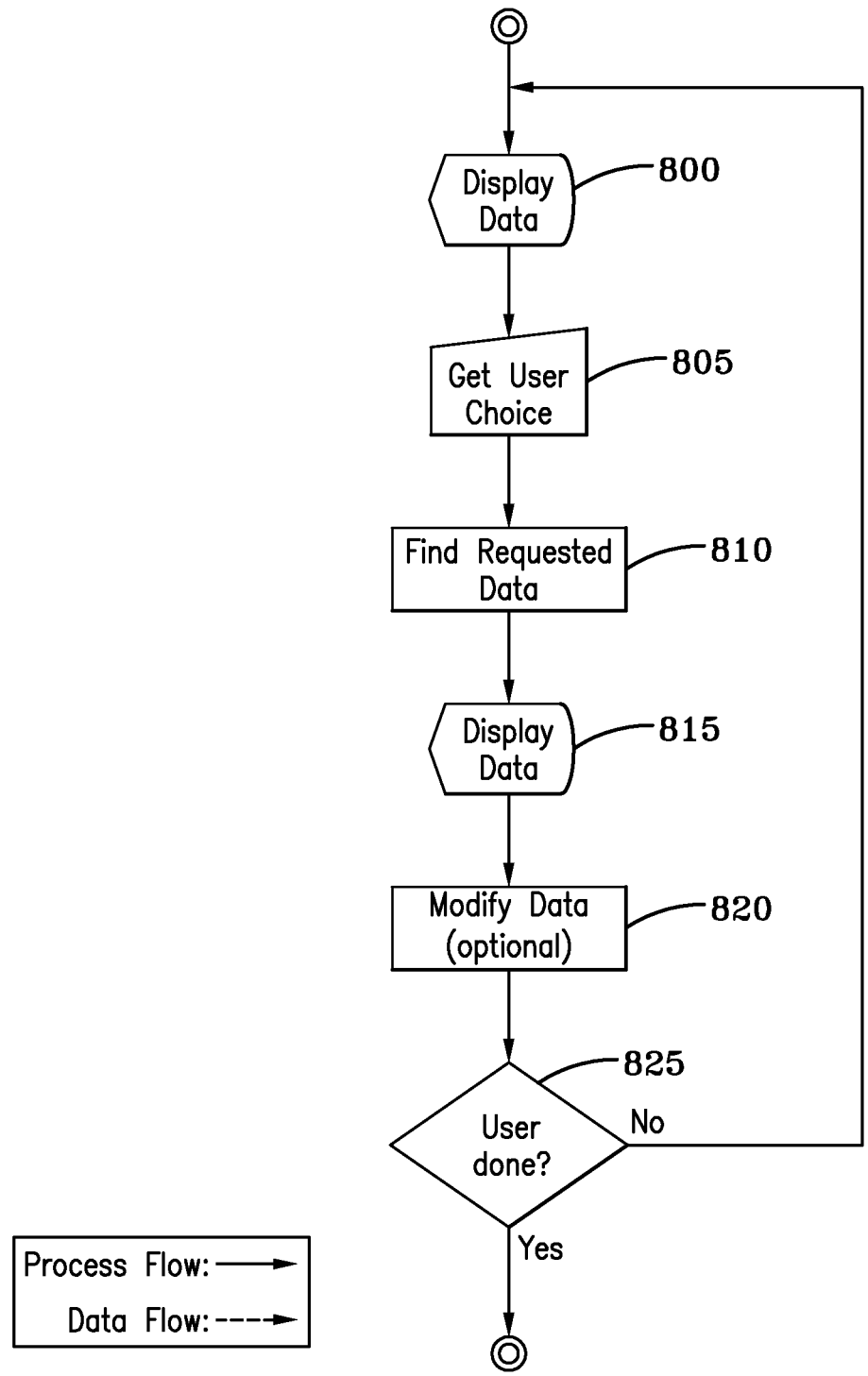
FIG. 8 is a flowchart of the user analysis process of the invention.

The functions of the user analysis process are shown in FIG. 8. First the user can display applicable data in step (800). The user may not want to display all the data simultaneously, so we need a logical subset of the data that is immediately applicable, with the ability for the user to drill deeper as needed together with the guidance necessary to focus in on the data. Immediately applicable data can be the type of event or the actors involved. Another option is that the data can be divided into logical groupings of data within the event. For example, if the data is regarding a weapon detonation event, there are two logical subsets. The first is fusing data (i.e. reasons the weapon detonated). The second is hit data (i.e. the result of the detonation). The user could then pick which subset to drill down into. Therefore, we next obtain the user choice of data to examine (805). Then, we find the requested data (810). The data will reside in one of three locations in the simulation: the general array (210), the results file, or the ramifications file. This function will find the appropriate location and retrieve the value. The location of the data is dependent on the simulation architecture. The next step is to display the requested data (815). The formatting method for displaying the data depends on the user application. Next, there is the optional function to modify the requested data (820). Again this function will be implemented if the architecture can support it. A modification could be as simple as changing the value of a single state variable and as complex as changing an entire set of ramifications. Finally, the user must be able to refine and redefine data searches. This includes finding additional related data and starting a new data search from the top. Therefore in the last step the user is asked if his search is complete (825). If not the process is repeated, if so, the process is exited.

Figure 9:
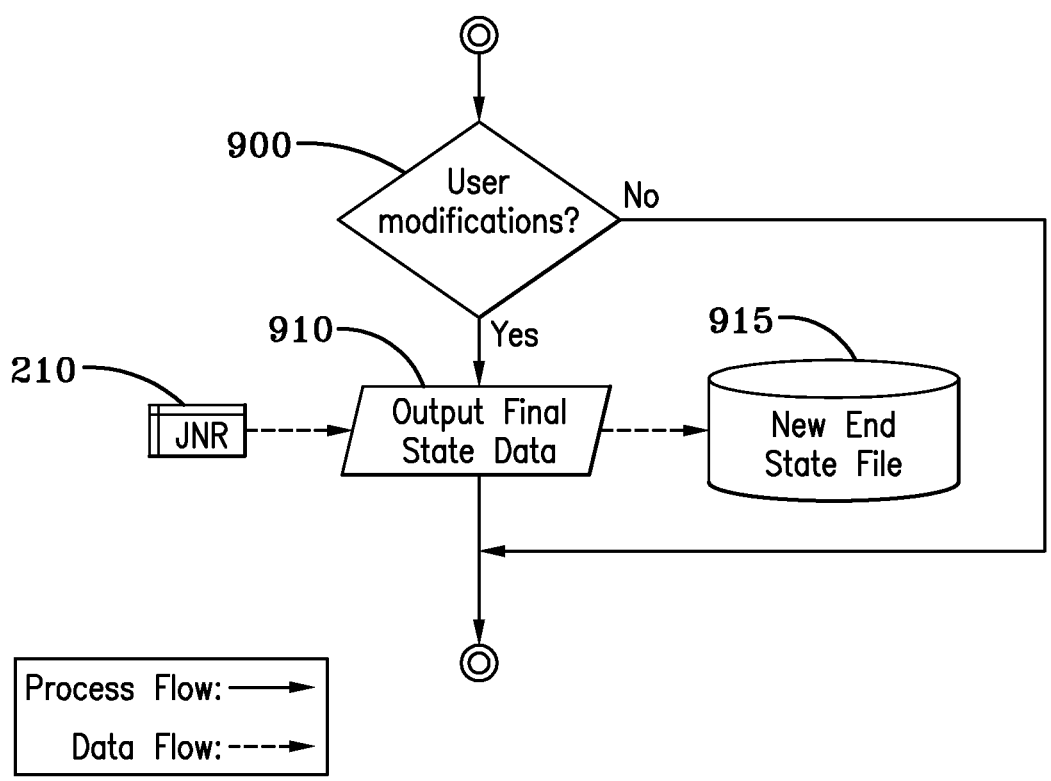
FIG. 9 is a flowchart of the post-processing phase of the invention.

After the user has found and analyzed his data, the process is shut down in the post-processing phase. The extent of the shutdown is determined by the user action in the event analysis phase. Referring to FIG. 9, the user has the choice of altering state data within the simulation at a given point in the past (900). If this choice is taken, the modified final state of the simulation must be output (910) and saved in the same format that the current method uses in a new final end state file (915). This new file can then be used as input to the original simulation, allowing the user to rerun the simulation from the new initial conditions and observe the effects of the change. However, if the user does not make any modification, no additional work needs to be done. The process simply shuts down normally without modifying the original end state and event files.

The above description is that of current embodiments of the invention. Various alterations and changes can be made without departing from the spirit and broader aspects of the invention as defined in the appended claims.

What is claimed is:

1. A method for analyzing a discrete event simulation comprising:
    pre-processing simulation data, wherein pre-processing simulation data comprises:
        creating a dynamic memory;
        reading final simulation state values from an end state file;
        loading the final simulation state values to the dynamic memory;
        reading a last executed event from an event file;
        loading a final event to the dynamic memory; and
        executing a rewind process;
    obtaining a desired event stream of the simulation data for manipulation based on user input;
    manipulating the event stream of the simulation data based on the user input;
    analyzing the simulation data within the manipulated event stream;
    modifying the simulation data within the manipulated event stream; and
    post processing the simulation data within the manipulated event stream.

2. The method of claim 1, wherein the event file contains a time-ordered list of events for a simulation user.

3. The method of claim 1, wherein the dynamic memory is created in a general array.

4. The method of claim 1, wherein obtaining a desired event stream of the simulation data for manipulation based on user input comprises:
    obtaining a time window of interest based on user input;
    obtaining events within the time window of interest from the event file;
    writing the found events within the time window of interest to a candidate event list;
    obtaining an action of interest based on user input;
    determining an event type from the action of interest;
    filtering events of a proper type using the candidate event list and re-writing the candidate event list with the filtered events;
    obtaining actors of interest;
    filtering events to proper actors of interest using the candidate event list;
    re-writing the candidate event list with the events filtered to the proper actors;
    determining whether there are multiple events on the re-written candidate event list;
    displaying the multiple events if they exist;
    obtaining the user's choice of the multiple events; and
    writing the user's chosen event to the event file.

5. The method of claim 1, wherein analyzing the simulation data within the manipulated event stream comprises:
    reading a target event from the event file;
    preparing the target event for analysis;
    writing the target event to a target event file;
    determining whether the target event is a past event or a future event;
    executing a rewind process when the target event is a past event;
    executing a fast forward process when the target event is a future event;
    determining whether the target event has been reached;
    re-executing determining whether the target event is a past event or a future event when it is determined that the target event has not been reached;
    determining whether the discrete event simulation is rewinding when it has been determined that the target event has been reached;
    executing the rewind process when it has been determined that the discrete event simulation is rewinding; and
    terminating the analysis of simulation data when it is determined that the discrete event simulation is not rewinding.

6. The method of claim 5, wherein the rewind process comprises:
    obtaining an event prior to the target event from the event file and target event data;
    writing the event prior to the target event to a prior event file;
    obtaining results and ramification of the target event from the prior event file;
    writing the results to a results file;
    writing the ramifications to a ramifications file;
    restoring old state values from the results file;
    writing the old state values to the dynamic memory;
    restoring the old state values from the ramifications file;

writing the old state values to the dynamic memory;
determining whether there are child events;
removing the child events from player based event lists when it is determined that there are child events; and,
setting the prior event to the target event.

7. The method of claim 5, wherein the fast forward process comprises:
obtaining results and ramifications of the target event;
writing the results to a results file;
writing the ramifications to a ramifications file;
storing new state values from the results file in the dynamic memory;
storing new state values from the ramifications file in the dynamic memory;
determining whether there are child events;
adding the child events to player based event lists(s) when it is determined that there are child events;
obtaining a next event after the target event;
writing the next event to a next event file; and,
setting the next event to the target event.

8. A non-transitory computer readable medium of one or more processors on one or more network devices having stored therein a plurality of instructions for executing a method for analyzing a discrete event simulation comprising the steps of:
pre-processing simulating data;
obtaining a desired event stream of the simulation data for manipulation based on user input, wherein pre-processing simulation data comprises:
creating a dynamic memory;
reading final simulation state values from an end state file;
loading the final simulation state values to the dynamic memory;
reading a last executed event from an event file;
loading a final event to the dynamic memory; and
executing a rewind process;
manipulating the event stream of the simulation data based on user input;
analyzing the simulation data within the manipulated event stream;
modifying the simulation data within the manipulated event stream; and
post processing the simulation data within the manipulated event stream.

9. The non-transitory computer readable medium of claim 8, wherein the event file contains a time-ordered list of events for a simulation user.

10. The non-transitory computer readable medium of claim 8, wherein the dynamic memory is created in a general array.

11. The non-transitory computer readable medium of claim 8, wherein obtaining a desired event stream of the simulation data for manipulation based on user input comprises:
obtaining a time window of interest based on user input;
obtaining events within the time window of interest from the event file;
writing the found events within the time window of interest to a candidate event list;
obtaining an action of interest based on user input;
determining an event type from the action of interest;
filtering events of a proper type using the candidate event list and re-writing the candidate event list with the filtered events;
obtaining actors of interest;
filtering events to proper actors of interest using the candidate event list;
re-writing the candidate event list with the events filtered to the proper actors;
determining whether there are multiple events on the re-written candidate event list;
displaying the multiple events if they exist;
obtaining the user's choice of the multiple events; and
writing the user's chosen event to the event file.

12. The non-transitory computer readable medium of claim 8, wherein analyzing the simulation data within the manipulated event stream comprises:
reading a target event from the event file;
preparing the target event for analysis;
writing the target event to a target event file;
determining whether the target event is a past event or a future event;
executing a rewind process when the target event is a past event;
executing a fast forward process when the target event is a future event;
determining whether the target event has been reached;
re-executing determining whether the target event is a past event or a future event when it is determined that the target event has not been reached;
determining whether the event simulation is rewinding when it has been determined that the target event has been reached;
executing the rewind process when it has been determined that the discrete event simulation is rewinding; and,
terminating the analysis of simulation data when it is determined that the discrete event simulation is not rewinding.

13. The non-transitory computer readable medium of claim 12, wherein the rewind process comprises:
obtaining an event prior to the target event from the event file and target event data;
writing the event prior to the target event to a prior event file;
obtaining results and ramification of the target event from the prior event file;
writing the results to a results file;
writing the ramifications to a ramifications file;
restoring old state values from the results file;
writing the old state values to the dynamic memory;
restoring the old state values from the ramifications file;
writing the old state values to the dynamic memory;
determining whether there are child events;
removing the child events from player based event lists when it is determined that there are child events; and,
setting the prior event to the target event.

14. The non-transitory computer readable medium of claim 12, where the fast forward process comprises:
obtaining results and ramifications of target event;
writing the results to a results file;
writing the ramifications to a ramifications file;
storing new state values from the results file in the dynamic memory;
storing new state values from the ramifications file in the dynamic memory;
determining whether there are child events;
adding the child events to player based event list(s) when it is determined that there are child events;
obtaining a next event after the target event;
writing the next event to a next event file; and,
setting the next event to the target event.

15. The non-transitory computer readable medium of claim 14, wherein the post processing phase comprises:

determining whether user wants to make modifications to chosen simulation data;
outputting final state data from the dynamic memory when user wants to make modifications to the chosen simulation data;
writing the final state data to a new end state file; and,
terminating the discrete simulation when the user does not want to make modifications to the simulation data.

* * * * *